(12) United States Patent
Goh et al.

(10) Patent No.: US 10,107,911 B1
(45) Date of Patent: Oct. 23, 2018

(54) PROXIMITY SENSOR AND MOBILE DEVICE USING THE SAME

(71) Applicant: LITE-ON SINGAPORE PTE. LTD., Midview (SG)

(72) Inventors: Teck-Chai Goh, Singapore (SG); Sin-Heng Lim, Singapore (SG); Guang-Li Song, Singapore (SG); Arakere Dinesh Gopalaswamy, Bangalore (IN)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 15/794,481

(22) Filed: Oct. 26, 2017

(30) Foreign Application Priority Data

Jul. 5, 2017 (CN) .......................... 2017 1 0542891

(51) Int. Cl.
*G01J 5/00* (2006.01)
*G01S 17/02* (2006.01)
(Continued)

(52) U.S. Cl.
CPC .......... *G01S 17/026* (2013.01); *G01S 7/4813* (2013.01); *H01L 25/165* (2013.01); *H01L 25/167* (2013.01); *H01L 31/02327* (2013.01); *H01L 31/16* (2013.01); *H05K 1/181* (2013.01); *G06F 1/3231* (2013.01); *H05K 2201/10106* (2013.01);
(Continued)

(58) Field of Classification Search
CPC ........... H01L 31/0203; H01L 31/02327; H01L 31/173; H01L 2924/1815; G01S 7/4813; G01S 7/4816; G01S 7/4814; G01S 17/026; Y02E 10/52; G01J 1/4204; G01J 1/44; G01J 2001/4242; G01J 1/4228; G06F 1/3203; G06F 1/3231; G06F 3/0346; G06F 3/0383; G06F 3/0485; G06F 3/04883; G06F 2203/04808; H04M 1/72569; H04M 1/72572; H04M 1/0214; H04M 1/0245;
(Continued)

(56) References Cited

U.S. PATENT DOCUMENTS

| | | | |
|---|---|---|---|
| 8,928,893 B2 * | 1/2015 | Findlay | H03K 17/941 250/214 AL |
| 2006/0016994 A1 * | 1/2006 | Basoor | G01V 8/12 250/338.1 |

(Continued)

*Primary Examiner* — Kiho Kim
(74) *Attorney, Agent, or Firm* — Li & Cai Intellectual Property (USA) Office

(57) ABSTRACT

A proximity sensor and a mobile device using the same are provided. The proximity sensor includes a circuit board, an emitter package, a receiver package, a plastic casing and a lens. The emitter package is disposed on the circuit board and includes an emitter and an emitter housing. The receiver package is disposed on the circuit board and includes a receiver and a receiver housing. The plastic casing covers the emitter package and the receiver package. The plastic casing includes a first opening corresponding to the emitter package and a second opening corresponding to the receiver package. The first opening has a first geometric centerline and the second opening has a second geometric centerline. The height of the emitter package is smaller than that of the receiver package, and the emitter is disposed between the first geometric centerline and the second geometric centerline.

10 Claims, 2 Drawing Sheets

(51) Int. Cl.
*H05K 1/18* (2006.01)
*H01L 25/16* (2006.01)
*H01L 31/16* (2006.01)
*G01S 7/481* (2006.01)
*H01L 31/0232* (2014.01)
*G06F 1/32* (2006.01)

(52) U.S. Cl.
CPC .............. *H05K 2201/10121* (2013.01); *H05K 2201/10151* (2013.01)

(58) Field of Classification Search
CPC . H04M 1/22; H04M 2250/12; H04W 52/027; Y02D 70/00; Y02D 10/173
See application file for complete search history.

(56) References Cited

U.S. PATENT DOCUMENTS

| | | | | |
|---|---|---|---|---|
| 2008/0006762 | A1* | 1/2008 | Fadell | G01J 1/4204 250/201.1 |
| 2008/0296478 | A1* | 12/2008 | Hernoult | G01J 1/02 250/216 |
| 2010/0078562 | A1* | 4/2010 | Dinh | G01J 1/02 250/339.06 |
| 2011/0121181 | A1* | 5/2011 | Costello | G01S 7/4813 250/338.1 |
| 2011/0163233 | A1* | 7/2011 | Ng | G01J 1/28 250/338.4 |
| 2011/0180693 | A1* | 7/2011 | Ritter | G01J 1/46 250/214 A |
| 2011/0204233 | A1* | 8/2011 | Costello | G01S 7/4813 250/338.4 |
| 2011/0226952 | A1* | 9/2011 | Shih | G01J 1/02 250/338.1 |
| 2015/0115138 | A1* | 4/2015 | Heng | G01J 1/0407 250/216 |
| 2015/0212208 | A1* | 7/2015 | Hanada | H01L 31/0203 250/221 |
| 2016/0234365 | A1* | 8/2016 | Alameh | H04W 52/0254 |
| 2016/0259056 | A1* | 9/2016 | Heng | G01S 17/08 |
| 2017/0160427 | A1* | 6/2017 | Costello | G01V 8/12 |
| 2017/0186886 | A1* | 6/2017 | Weng | G01J 1/4204 |
| 2017/0284864 | A1* | 10/2017 | Chen | G01J 1/0204 |
| 2017/0301661 | A1* | 10/2017 | Makimura | H01L 31/02164 |

\* cited by examiner

PROXIMITY SENSOR AND MOBILE DEVICE USING THE SAME

BACKGROUND OF THE INVENTION

1. Field of the Invention

The present disclosure relates to a sensor; more particularly, to a proximity sensor and a mobile device using the same.

2. Description of Related Art

As technology advances, mobile devices with a touch screen have become increasingly popular, leading to a rising demand for a built-in proximity sensor. A proximity sensor serves to sense the face, ear and hair of a user when the user is having a phone call, and temporarily turns off the touch control function so as to save power on the one hand and prevent inadvertent touch inputs on the other.

The emitter and the detector of a prior art proximity sensor are disposed separate from each other on the inner side of the touch screen, and an infrared shielding separator is disposed between the emitter and the detector to reduce crosstalk. However, the above structure in the prior art takes up much inner space of the mobile device, which does not appeal to the market. Therefore, there has been an increasing demand for integrating the emitter, the detector and the infrared shielding separator into one single package. Nevertheless, the emitter, the detector and the infrared shielding separator being in one package increases the crosstalk levels.

Furthermore, the miniaturization of the opening for the proximity sensor on the mobile phone casing and the combination of the emitter opening with the detector opening are also demanded by the market, which brings the challenge of reducing the distance between the emitter and the detector while at the same time maintaining the size of the detector opening. However, with the emitter and the detector being brought closer to one another, the crosstalk level will increase, thus decreasing the sensitivity of the proximity sensor.

SUMMARY OF THE INVENTION

Accordingly, one of the objectives of the present disclosure is to provide a mobile device and a proximity sensor thereof, in which the proximity sensor has an enhanced sensitivity.

One embodiment of the present disclosure provides a proximity sensor including a circuit board, an emitter package, a receiver package, a plastic casing and a lens. The emitter package is disposed on the circuit board and includes an emitter and an emitter housing. The receiver package is disposed on the circuit board, and includes a receiver and a receiver housing. The plastic casing covers the emitter package and the receiver package, wherein the plastic casing includes a first opening corresponding to the emitter package and a second opening corresponding to the receiver package, the first opening having a first geometric centerline and the second opening having a second geometric centerline. The lens is disposed on the emitter package, wherein light emitted by the emitter passes through the lens and exits the proximity sensor from the first opening. The height of the emitter package is smaller than that of the receiver package, and the emitter is disposed between the first geometric centerline and the second geometric centerline.

Another embodiment of the present disclosure provides a mobile device using a proximity sensor. The proximity sensor includes a circuit board, an emitter package, a receiver package, a plastic casing and a lens. The emitter package is disposed on the circuit board and includes an emitter and an emitter housing. The receiver package is disposed on the circuit board, and includes a receiver and a receiver housing. The plastic casing covers the emitter package and the receiver package, wherein the plastic casing includes a first opening corresponding to the emitter package and a second opening corresponding to the receiver package, the first opening having a first geometric centerline and the second opening having a second geometric centerline. The lens is disposed on the emitter package, wherein light emitted by the emitter passes through the lens and exits the proximity sensor from the first opening. The height of the emitter package is smaller than that of the receiver package, and the emitter is disposed between the first geometric centerline and the second geometric centerline.

One of the advantages of the mobile phone and the proximity sensor thereof of the present disclosure is that, with the technical features that the height of the emitter package is smaller than that of the receiver package, and that the emitter is disposed between the first geometric centerline and the second geometric centerline, the proximity sensor has less crosstalk and can thus achieve enhanced accuracy.

For a better understanding of the present disclosure, the following embodiments are provided along with illustrations to facilitate the disclosure of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure will be illustrated in the following description and appended drawings.

Figure 1:
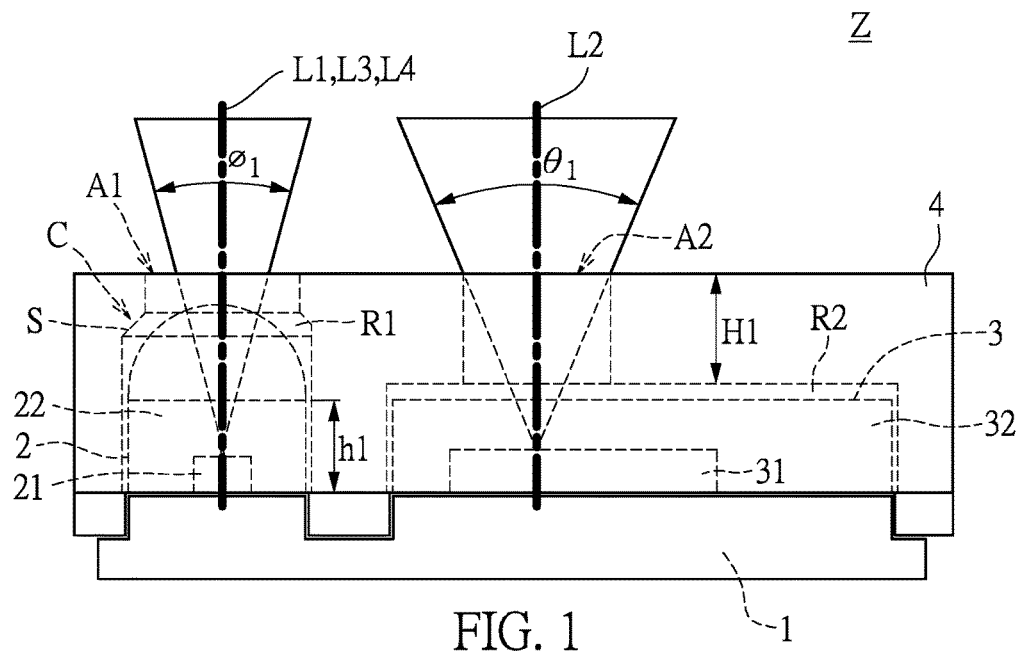
FIG. 1 is a side view illustrating a proximity sensor according to an embodiment of the present disclosure.
Figure 2:
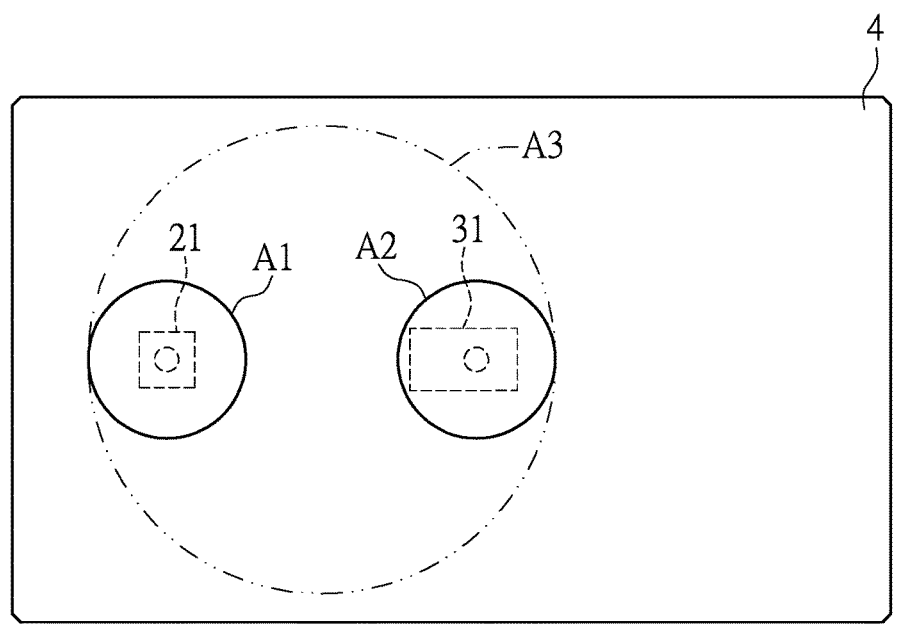
FIG. 2 is a top view illustrating the proximity sensor according to the embodiment of the present disclosure.

Referring to FIGS. 1 and 2, the present disclosure provides a proximity sensor Z including a circuit board 1, an emitter package 2, a receiver package 3, a plastic casing 4, and a lens 5. The emitter package 2 is disposed on the circuit board 1 and includes an emitter 21 and an emitter housing 22. In the present embodiment, the emitter 21 is an infrared light emitting diode (IR LED); however, the present disclosure is not limited thereto. The receiver package 3 is disposed on the circuit board 1 and includes a receiver 31 and a receiver housing 32.

Furthermore, the plastic casing 4 covers the emitter package 2 and the receiver package 3, in which the plastic casing 4 includes a first opening A1 corresponding to the emitter package 2 and a second opening A2 corresponding to the receiver package 3. The first opening A1 has a first geometric centerline L1 and the second opening A2 has a second geometric centerline L2. The lens 5 is disposed on the emitter package 2, in which light (not shown in the drawings) emitted by the emitter 21 passes through the lens 5 and exits the proximity sensor Z from the first opening A1.

Figure 3:
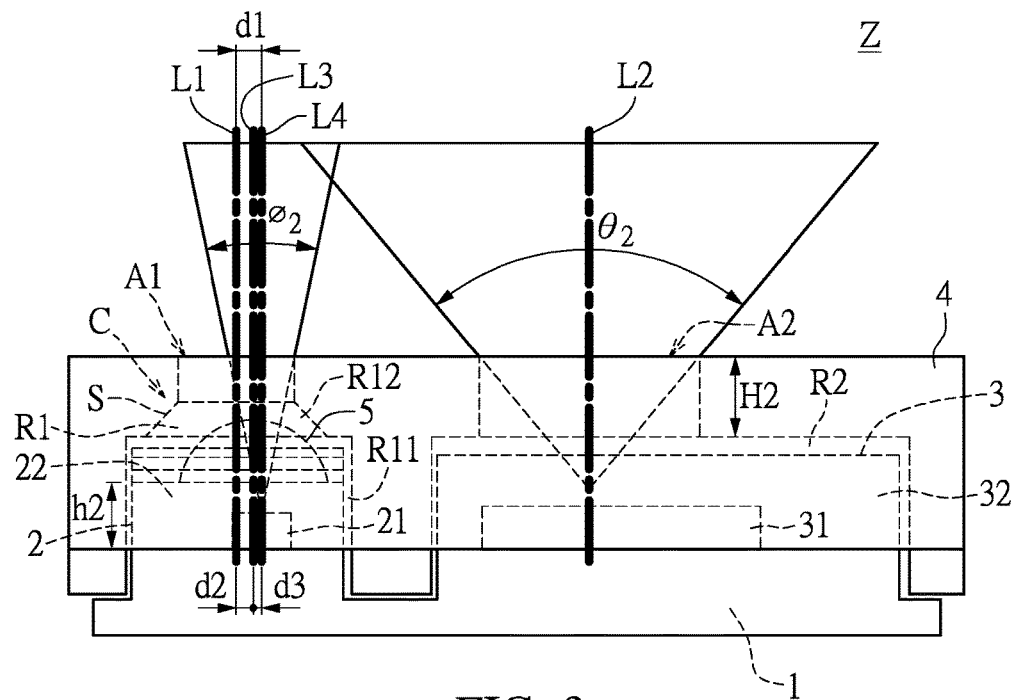
FIG. 3 is a side view illustrating the proximity sensor according to the embodiment of the present disclosure with rearranged and resized components.
Figure 4:
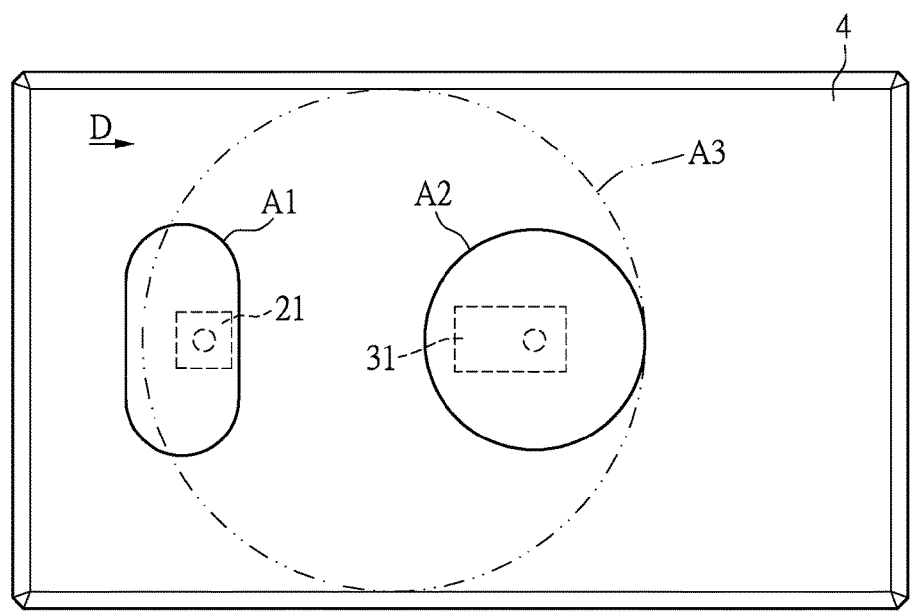
FIG. 4 is a side view illustrating the proximity sensor according to the embodiment of the present disclosure with rearranged and resized components.

With reference to FIGS. 3 and 4, to enhance the accuracy of the proximity sensor Z, the present disclosure provides a proximity sensor Z with rearranged and resized components. The differences between the proximity sensor Z of FIGS. 1 and 2 and that of FIGS. 3 and 4 will be described herein with reference to FIGS. 1 to 4.

The first difference between the proximity sensor Z of FIGS. 1 and 2 and that of FIGS. 3 and 4 is that in FIGS. 1 and 2, the height h1 of the emitter housing 22 is equal to the height of the receiver housing 32, while in FIGS. 3 and 4 the height h2 of the emitter housing 22 is smaller than the height of the receiver housing 32.

By reducing the height of the emitter housing 22, the height of the lens 5, which is disposed on the emitter package 2, is decreased, thus lowering the level of light leakage. Furthermore, when the proximity sensor Z is applied to a mobile device (not shown in the drawings) with a touch screen, the reduction of the height of the emitter housing 22 leads to less crosstalk induced when the receiver 31 receives light emitted by the emitter 21 and reflected by the inner surface of the touch screen. More specifically, in the present embodiment, the height of the lens 5 in FIG. 1 is 1.35 mm and that in FIG. 3 is 1.06 mm. However, the present disclosure is not limited thereto.

Moreover, the second difference between the proximity sensor Z of FIGS. 1 and 2 and the proximity sensor Z of FIGS. 3 and 4 is that the emitter 21 of FIG. 3 is situated between the first geometric centerline L1 and the second geometric centerline L2. As can be seen from FIG. 3, the emitter 21 deviates from the first geometric centerline L1 by a deviation distance d1. Through the technical solution that the emitter 21 deviates from the first geometric centerline L1 and is situated between the first geometric centerline L1 and the second geometric centerline L2, the light emission angle $\varphi_1$ of the emitter 21 can be narrowed. Comparing FIG. 1 with FIG. 3, the light emission angle $\varphi_2$ of emitter 21 in FIG. 3 is smaller than the light emission angle $\varphi_1$ of the emitter 21 in FIG. 1. Therefore, the receiver 31 receives light emitted by the emitter 21 and reflected by the touch screen (not shown in the drawings), thereby decreasing the level of crosstalk.

Furthermore, apart from the emitter 21, the optical axis of the lens 5 deviates from the first geometric centerline L1 as well. More specifically, referring to FIG. 3, the optical axis L3 of the lens 5 is between the first geometric centerline L1 and the optical axis L4 of the emitter 21, in which the distance between the optical axis L3 of the lens 5 and the first geometric centerline L1 is d2, and the distance between the optical axis L3 and the optical axis L4 of the emitter 21 is d3. Through the technical solution that the optical axis L3 of the lens 5 deviates from the first geometric centerline L1 and is situated between the first geometric centerline L1 and the optical axis L4 of the emitter 21, light emitted by the emitter 21 is refracted by the lens 5 and deflected towards the optical lens L3 of the lens 5. In this way, light emitted by the emitter 21 can be deflected towards the receiver 31 after being refracted by the lens 5. Accordingly, the receiver 31 receives less light emitted by the emitter 21 and reflected by the touch screen (not shown in the drawings) and the level of crosstalk inside the proximity sensor Z can be decreased.

Specifically, another difference between the proximity sensor Z of FIGS. 1 and 2 and the proximity sensor Z of FIGS. 3 and 4 is that the first opening A1 of the proximity sensor Z of FIGS. 3 and 4 is smaller than the first opening A1 of the proximity sensor Z of FIGS. 1 and 2. More specifically, the way the present embodiment reduces the mean radius of the first opening A1 is adjusting the chamfer structure C and forming the first opening A1 into an elliptic shape. However, the present disclosure is not limited thereto.

Moreover, the plastic casing 4 includes a first accommodating space R1 and a second accommodating space R2 that are situated inside the plastic casing 4. The first accommodating space R1 receives the emitter package 2 and the lens 5, and the second accommodating space R2 receives the receiver package 3. The first accommodating space R1 includes a first receiving room R11 that accommodates the emitter package 2 and a second receiving room R12 that accommodates the lens 5. An upper part of the second receiving room R12 has a chamfer structure C, which has a chamfered surface S tilted towards the lens 5. Referring to FIG. 1 with FIG. 3, the first opening A1 of FIG. 3 has an average radius that is smaller than the first opening A1 of FIG. 1 with an extended the chamfer structure C and an increased tilt angle of the chamfered surface S.

Moreover, the emitter package 2 and the receiver package 3 of the proximity sensor Z of FIGS. 3 and 4 are arranged along a predetermined direction D, and the first opening A1 is in the shape of an ellipse. The minor axis of the ellipse is parallel to the predetermined direction D. More specifically, the mean radius of the first opening A1 of the proximity sensor Z of FIG. 1 is 0.35 mm, the length of the semi-minor axis of the first opening A1 of the proximity sensor Z of FIGS. 3 and 4 is 0.2 mm and the mean radius thereof 0.25 mm. However, the present disclosure is not limited by the specific size of the first opening A1.

By forming the first opening A1 into a near elliptic opening in which the minor axis is parallel to the predetermined direction D, the width of the first opening A1 in the predetermined direction D is reduced, by which the light emission angle of the emitter 21 in the predetermined direction D is decreased. Comparing FIG. 1 with FIG. 3, the light emission angle $\varphi_2$ of the emitter 21 is smaller than the light emission angle $\varphi_1$ of the emitter 21. With a narrowed light emission angle of the emitter 21, light emitted by the emitter 21 and reflected by the touch screen (not shown in the drawings) is reduced. Accordingly, the level of crosstalk inside the proximity sensor Z is decreased.

Furthermore, yet another difference between the proximity sensor Z of FIGS. 1 and 2 and the proximity sensor Z of FIGS. 3 and 4 is that the receiver 31 of FIGS. 3 and 4 has a detection angle larger than the receiver 31 of FIGS. 1 and 2. More specifically, by increasing the radius of the second opening A2 and reducing the thickness of the plastic casing 4, the present disclosure increases the detection angle of the receiver 31. However, the present disclosure is not limited thereto.

With reference to FIGS. 1 to 4, the thickness H1 of the plastic casing 4 of the proximity sensor Z in FIGS. 1 and 2 is 0.5 mm, and the thickness H2 of the plastic casing 4 in FIGS. 3 and 4 is 0.38 mm. In addition, the diameter of the second opening A2 of FIG. 3 is 0.96 mm, which is greater than that of FIG. 1. Specifically, the diameter of the second opening A2 in FIG. 1 is 0.7 mm. Through the aforementioned ways of increasing the detection angle of receiver 31, the detection angle of the receiver 31 is enlarged from $\theta_1$ to $\theta_2$, in which $\theta_1$ is 40 degrees and $\theta_2$ is 80 degrees. It should be noted that the ways of rearranging and resizing the components of the proximity sensor Z are not limited to the above-described examples.

In summary, with the rearranged and resized components, the detection angle of the receiver 31 of the proximity sensor Z is enlarged and the light emission angle of the emitter 21 is reduced, thereby enhancing the sensitivity of the proximity sensor Z. It should be noted that the above disclosed ways of rearrangement and resizing do not change the distance between the emitter 21 and the receiver 31, that is to say, no further space inside the mobile device is occupied and the size of the opening A3 on the mobile device casing for the proximity sensor Z can remain the same. Through the above disclosed technical solutions, the proximity sensor Z has less crosstalk and can thus achieve enhanced accuracy without sacrificing the inner space of the mobile device or having to enlarge the opening A3.

One of the advantages of the mobile phone and the proximity sensor thereof of the present disclosure is that, with the technical features that the height of the emitter package is smaller than that of the receiver package, and that the emitter is disposed between the first geometric centerline and the second geometric centerline, the proximity sensor has less crosstalk and can thus achieve enhanced accuracy.

The description illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A proximity sensor, comprising:
   a circuit board;
   an emitter package disposed on the circuit board, the emitter package including an emitter and an emitter housing;
   a receiver package disposed on the circuit board, the receiver package including a receiver and a receiver housing;
   a plastic casing covering the emitter package and the receiver package, wherein the plastic casing includes a first opening corresponding to the emitter package and a second opening corresponding to the receiver package, the first opening having a first geometric centerline and the second opening having a second geometric centerline, and
   a lens disposed on the emitter package, wherein light emitted by the emitter passes through the lens and exits the proximity sensor from the first opening,
   wherein the height of the emitter package is smaller than that of the receiver package, and the emitter is disposed between the first geometric centerline and the second geometric centerline.

2. The proximity sensor according to claim 1, wherein an optical axis of the lens is between the first geometric centerline and the second geometric centerline.

3. The proximity sensor according to claim 1, wherein the emitter package and the receiver package are arranged along a predetermined direction, and wherein the first opening is in the shape of an ellipse, in which the minor axis of the ellipse is parallel to the predetermined direction.

4. The proximity sensor according to claim 3, wherein the mean radius of the first opening is 0.25±0.02 millimeters.

5. The proximity sensor according to claim 1, wherein the plastic casing includes a first accommodating space and a second accommodating space that are located inside the plastic casing, and wherein the first accommodating space includes a first receiving room that accommodates the emitter package and a second receiving room that accommodates the lens, in which an upper part of the second receiving room has a chamfer structure, which has a chamfered surface tilted towards the lens.

6. The proximity sensor according to claim 1, wherein a detection angle of the receiver is approximately 80±2 degrees.

7. The proximity sensor according to claim 1, wherein the emitter is an infrared light-emitting diode.

8. A mobile device using a proximity sensor, the proximity sensor comprising:
   a circuit board;
   an emitter package disposed on the circuit board, the emitter package including an emitter and an emitter housing;
   a receiver package disposed on the circuit board, the receiver package including a receiver and a receiver housing;
   a plastic casing covering the emitter package and the receiver package, wherein the plastic casing includes a first opening corresponding to the emitter package and a second opening corresponding to the receiver package, the first opening having a first geometric centerline and the second opening having a second geometric centerline, and
   a lens disposed on the emitter package, wherein light emitted by the emitter passes through the lens and exits the proximity sensor from the first opening,
   wherein the height of the emitter package is smaller than that of the receiver package, and the emitter is disposed between the first geometric centerline and the second geometric centerline.

9. The mobile device according to claim 8, wherein an optical axis of the lens is between the first geometric centerline and the second geometric centerline.

10. The mobile device according to claim 8, wherein the emitter package and the receiver package are arranged along a predetermined direction, and wherein the first opening is in the shape of an ellipse, in which the minor axis of the ellipse is parallel to the predetermined direction.

* * * * *